(12) United States Patent
Chroneos, Jr. et al.

(10) Patent No.: US 6,459,563 B1
(45) Date of Patent: Oct. 1, 2002

(54) METHOD AND APPARATUS FOR POLYGONAL HEAT SLUG

(75) Inventors: Robert J. Chroneos, Jr., Tempe; Koushik Banerjee, Chandler, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/842,305

(22) Filed: Apr. 25, 2001

Related U.S. Application Data

(63) Continuation of application No. 08/626,174, filed on Mar. 29, 1996, now Pat. No. 6,256,189.

(51) Int. Cl.[7] .................................................. H01G 4/38
(52) U.S. Cl. ...................................... 361/328; 361/306.2
(58) Field of Search ................ 361/709–711, 717–722, 361/328, 306.2; 257/712–713, 720, 706, 707; 174/52.4, 252; 165/185

(56) References Cited

U.S. PATENT DOCUMENTS

| | | | |
|---|---|---|---|
| 4,860,165 A | | 8/1989 | Casinelli ...................... 361/388 |
| 5,557,502 A | * | 9/1996 | Banerjee et al. ............. 361/712 |
| 5,597,034 A | | 1/1997 | Barker, III et al. ......... 165/80.3 |
| 5,660,227 A | | 8/1997 | Crowe .......................... 165/47 |

* cited by examiner

*Primary Examiner*—Anthony Dinkins
(74) *Attorney, Agent, or Firm*—Blakely, Sokoloff, Taylor & Zafman LLP

(57) ABSTRACT

An electronic package which has a polygonal shaped heat slug. The heat slug extends from a top surface of a package which has a plurality of vias. The package also has a number of capacitors that are mounted to the top surface. Some of the capacitors are located between the heat slug and the vias. The polygonal shape of the heat slug provides additional space on the top surface so that capacitors can be added without eliminating vias from the package.

20 Claims, 2 Drawing Sheets

METHOD AND APPARATUS FOR POLYGONAL HEAT SLUG

CROSS REFERENCE TO RELATED APPLICATION

This application claims the benefit of and is a continuation of U.S. Application Ser. No. 08/626,174, filed Mar. 29, 1996 now U.S. Pat. No. 6,256,189, entitled 'HEAT SLUG DESIGN WHICH FACILITATES MOUNTING OF DISCRETE COMPONENTS ON A PACKAGE WITHOUT LOSING LANDS OR PINS IN THE PACKAGE', now issued.

BACKGROUND OF THE INVENTION

1. Field of the Invention

The present invention relates to a package for an integrated circuit.

2. Description of Related Art

Integrated circuits are typically housed within a package that is soldered to a printed circuit board. Some packages contain a heat slug to facilitate the removal of heat generated by the integrated circuit. The package may also contain a number of discrete capacitors which filter the power and/or signals provided to the integrated circuit.

FIG. 1 shows a top surface of an integrated circuit package 2 of the prior art. The package 2 has a rectangular heat slug 4 that is surrounded by a number of through hole vias 6. The vias 6 provide interconnect to a plurality of lands located on the opposite bottom surface of the package. The lands are typically soldered to an external printed circuit board. The number of lands for the package are typically limited by the number of vias 6 that can be formed in the package 2.

Mounted to the top surface of the package are a number of capacitors 8. The capacitors 8 are mounted to surface pads 10 located on the top surface. The capacitors 8 and accompanying pads are relatively large and occupy valuable space on the top of the package. Some of the vias 6 must be eliminated to provide room for the capacitors. Eliminating vias reduces the number of lands and the pin throughput of the package. Adding more capacitors to the package would necessitate the elimination of more vias and further reduce the output pins of the package. It would be desirable to provide a package design that can add capacitors without eliminating more vias and corresponding lands.

SUMMARY OF THE INVENTION

The present invention is an electronic package which has a polygonal shaped heat slug. The heat slug extends from a top surface of a package which has a plurality of vias. The package also has a number of capacitors that are mounted to the top surface. Some of the capacitors are located between the heat slug and the vias. The polygonal shape of the heat slug provides additional space on the top surface so that capacitors can be added without eliminating vias from the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
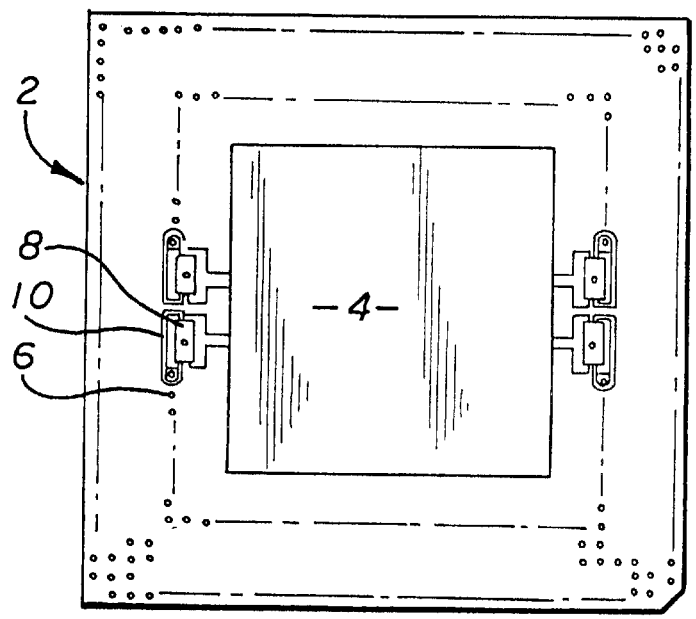
FIG. 1 is a top view of an electronic package of the prior art.
Figure 2:
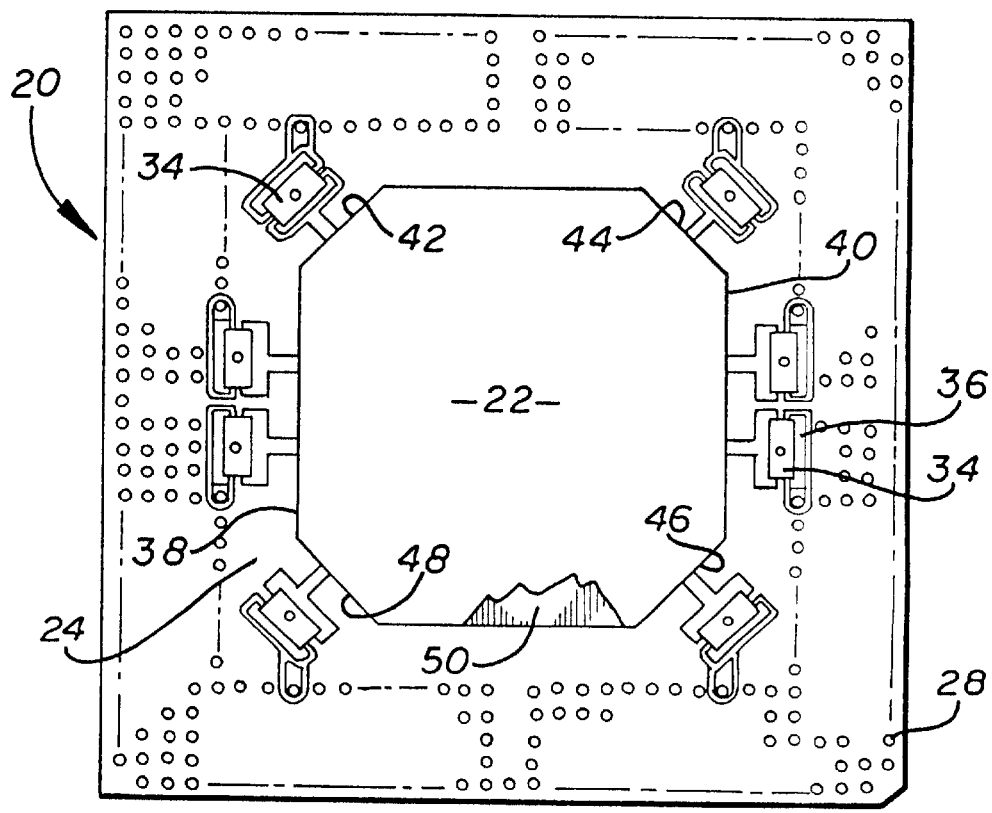
FIG. 2 is a top view of an electronic package of the present invention.
Figure 3:
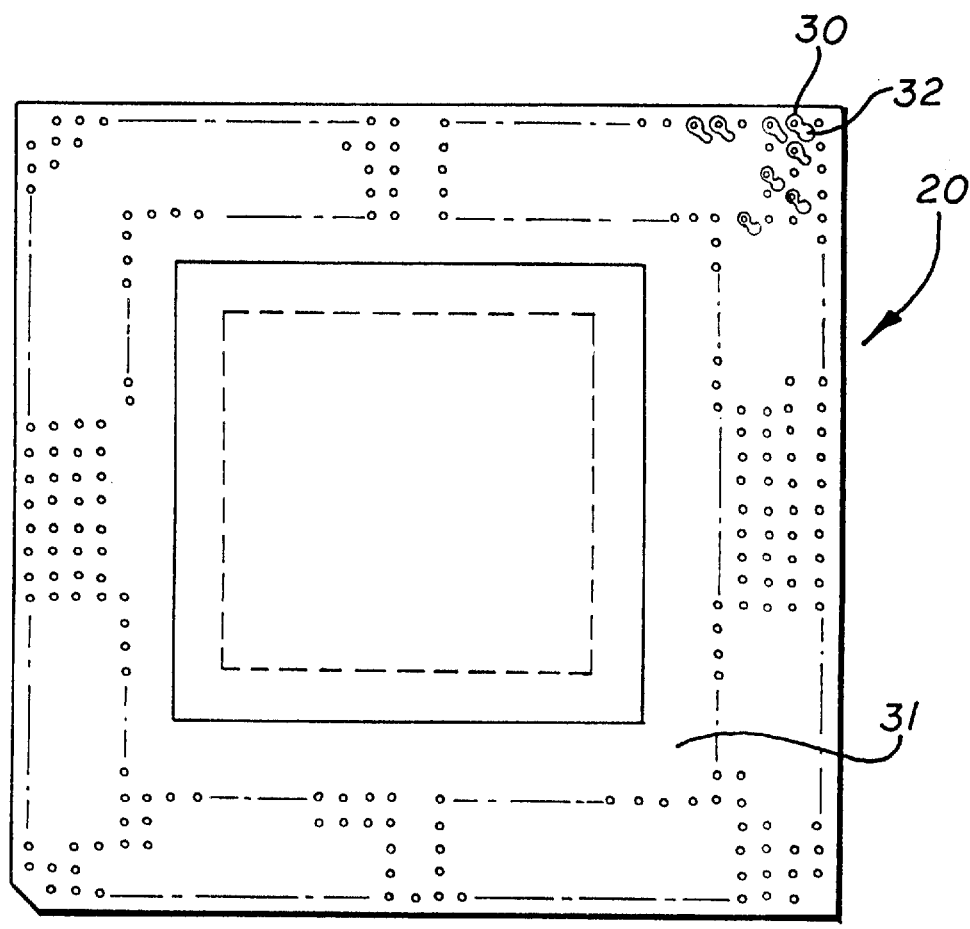
FIG. 3 is a bottom view of the package shown in FIG. 2.
Figure 4:
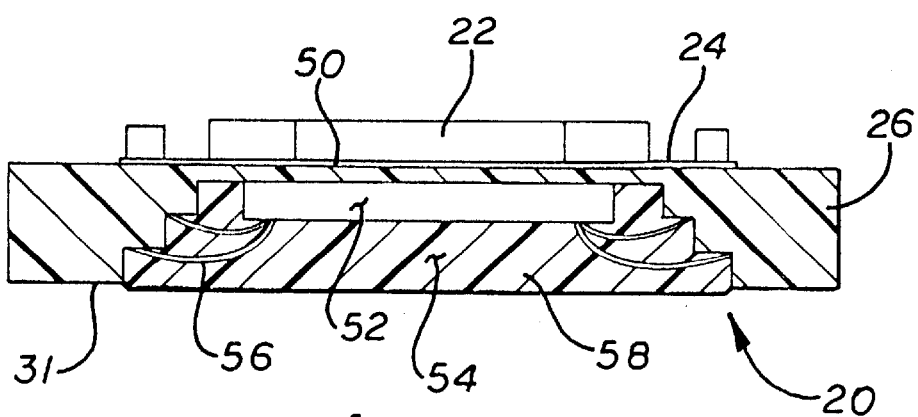
FIG. 4 is a cross-sectional view of the package shown in FIG. 2.

Referring to the drawings more particularly by reference numbers, FIGS. 2–4 show an electronic package 20 of the present invention. As shown in FIG. 2, the package 20 has a heat slug 22 extending from the top surface 24 of a substrate 26. The heat slug 22 has a polygonal shape to reduce the overall area of the slug 22. In the preferred embodiment the heat slug 22 has an octagonal shape. Although an octagonal shape is shown and described, it is to be understood that the heat slug 22 may have any shape that has at least five sides. The heat slug 22 is preferably constructed from a thermally conductive material such as a nickel plated copper.

The substrate 26 is preferably a printed circuit board which has a two-dimensional array of vias 28. The vias 28 on the top surface of the package 20 typically extend to via pads 30 located on the bottom surface 31 of the package shown in FIG. 3. The via pads 30 are connected to corresponding land pads 32. The land pads 32 are typically soldered to an external printed circuit board (not shown). Although land pads 32 in a land grid array (LGA) package are shown and described, it is to be understood that the package may contain pins within a pin grid array package (PGA), or solder bumps within a ball grid array (BGA) package. Additionally, although a printed circuit board is shown and described, it is to be understood that the substrate 26 may be constructed from other materials such as co-fired ceramic.

Referring to FIG. 2, the package 20 has a plurality of discrete electronic devices 34 mounted to the top surface of the substrate 26. In the preferred embodiment, the discrete devices 34 are capacitors. The capacitors 34 typically filter power and/or signals provided to the package. Although capacitors are shown and described, it is to be understood that the discrete devices 34 may be any active or passive component such as a resistor.

The devices 34 are preferably soldered to a pair of surface pads 36 located on the top surface of the printed circuit board 26. Four of the devices 34 can be mounted in an area adjacent to a pair of opposing sides 38 and 40 of the heat slug 22. In the embodiment disclosed, the side mounted devices 34 will each eliminate three vias 28 from the package to provide room for the surface pads 36.

The package 20 also has four additional devices that are mounted between the corner sides 42–48 of the heat slug 22 and the vias 28. The polygonal shape provides enough clearance between the heat slug 22 and the vias 28 to allow the devices 34 to be mounted to the printed circuit board 26 without eliminating vias from the package 20. The polygonal shaped heat slug 22 thus provides a package that will support additional capacitors without eliminating vias 28 and corresponding land pads 32.

In the preferred embodiment, the heat slug 22 is mounted to a surface pad 50 of the circuit board 26 which is dedicated to electrical ground (Vss). One surface pad 36 of each device 34 may be routed to the ground pad 50. The other pad 36 may be connected to one of the vias 28 to electrically couple the devices to the internal circuitry of the package 20.

As shown in FIG. 3, the package 20 typically contains an integrated circuit 52 that is mounted to the package and located within a cavity 54 of the printed circuit board 26. The integrated circuit 52 may be mounted directly to the heat slug 22 to improve the thermal performance of the package. The integrated circuit 52 is coupled to the printed circuit board 26 by a plurality of bond wires 56. The cavity 54 and integrated circuit 52 are enclosed by an encapsulant 58. The integrated circuit 52 is preferably a microprocessor, although it is to be understood that the package 20 may contain any electrical device.

The package 20 is typically assembled by initially mounting the heat slug 22 and electrical devices 34 to the printed circuit board 26 with a solder reflow process. The integrated circuit 52 is then mounted to the heat slug 22 and wire bonded to the printed circuit board 26. The cavity 54 is then filled with an encapsulant 58 to enclose the integrated circuit 52.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
   a package which has a top surface and an opposite bottom surface;
   a plurality of contacts located on said bottom surface of said package; and,
   a polygonal shaped heat slug located in said top surface of said package.

2. The package as recited in claim 1, further comprising an electrical device mounted to said top surface of said package.

3. The package as recited in claim 2, wherein said top surface has a two-dimensional array of vias and said electrical device is located between said heat slug and said vias.

4. The package as recited in claim 3, wherein said top surface has a rectangular shape defined by a pair of intersecting diagonal lines that extend from opposing corners of said top surface, and said electrical device is located on one of the diagonal lines.

5. The package as recited in claim 2, wherein said electrical device is a capacitor.

6. A polygonal shaped heat slug for an electronic package, comprising:
   a thermally conductive material having
   a top surface,
   a bottom surface to couple to a substrate of the electronic package, and
   at least five sides to reduce the overall area of the heat slug and provide clearance to mount additional devices to the substrate of the electronic package.

7. The polygonal shaped heat slug as recited in claim 6, wherein
   at least one of the at least five sides is a corner side.

8. The polygonal shaped heat slug as recited in claim 6, wherein
   the polygonal shape has eight sides and the polygonal shaped heat slug is octagonally shaped.

9. The polygonal shaped heat slug as recited in claim 8, wherein
   four of the eight sides are corner sides.

10. The polygonal shaped heat slug as recited in claim 6, wherein
    the substrate of the electronic package is a printed circuit board.

11. The polygonal shaped heat slug as recited in claim 10, wherein
    the bottom surface of the thermally conductive material couples to a pad of the printed circuit board.

12. The polygonal shaped heat slug as recited in claim 6, wherein
    the thermally conductive material is nickel plated copper.

13. An electronic package, comprising:
    a printed circuit board having a plurality of contacts on a bottom surface and a plurality of vias on a top surface;
    an integrated circuit coupled to the printed circuit board;
    a polygonal shaped heat slug coupled to a surface of the integrated circuit, the polygonal shaped heat slug having at least five sides to reduce its overall area and provide clearance to mount additional devices to the printed circuit board; and,
    an electrical device coupled to the printed circuit board between the heat slug and at least one of the plurality of vias.

14. The electronic package as recited in claim 13, wherein the electrical device is a capacitor.

15. The electronic package as recited in claim 13, wherein the electrical device is coupled between a ground pad and one of the plurality of vias.

16. The electronic package as recited in claim 13, wherein at least one of the at least five sides of the polygonal shaped heat slug is a corner side.

17. The electronic package as recited in claim 13, wherein the polygonal shaped heat slug polygonal has eight sides and is octagonally shaped.

18. The electronic package as recited in claim 17, wherein four of the eight sides of the polygonal shaped heat slug are corner sides.

19. A method of assembling an electronic package, comprising:
    a) providing a printed circuit board having a plurality of contacts on a bottom surface and a plurality of vias on a top surface;
    b) mounting an integrated circuit to the printed circuit board;
    c) mounting a polygonal shaped heat slug to a surface of the integrated circuit, the polygonal shaped heat slug having at least five sides to reduce its overall area and provide clearance to mount additional devices to the printed circuit board; and
    d) mounting an electrical device to the top surface of the printed circuit board at a location between the heat slug and one of the plurality of vias.

20. The method as recited in claim 19, further comprising:
    e) enclosing the integrated circuit with an encapsulant.

* * * * *